(12) United States Patent
Lombaard et al.

(10) Patent No.: US 8,174,332 B1
(45) Date of Patent: May 8, 2012

(54) PHASE LOCK LOOP PRE-CHARGING SYSTEM AND METHOD

(75) Inventors: Carel J. Lombaard, Pretoria (ZA); Eugene O'Sullivan, Beara (IE); Paul Walsh, Cork (IE)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 12/641,121

(22) Filed: Dec. 17, 2009

Related U.S. Application Data

(63) Continuation of application No. 11/445,957, filed on Jun. 2, 2006, now Pat. No. 7,636,019.

(60) Provisional application No. 60/688,523, filed on Jun. 7, 2005.

(51) Int. Cl.
*H03B 5/00* (2006.01)
(52) U.S. Cl. ............ 331/185; 331/175; 331/17; 331/34; 331/16; 327/156
(58) Field of Classification Search .................... 331/17, 331/16, 34, 175, 185; 327/156
See application file for complete search history.

(56) References Cited

U.S. PATENT DOCUMENTS

| | | | |
|---|---|---|---|
| 6,476,681 B1 | 11/2002 | Kirkpatrick | |
| 7,199,673 B2 * | 4/2007 | Erdogan | 331/17 |
| 7,636,019 B1 | 12/2009 | Lombaard et al. | |

OTHER PUBLICATIONS

USPTO Notice of Allowance for U.S. Appl. No. 11/445,957 dated Jun. 26, 2009; 6 pages.
USPTO Non-Final Rejection for U.S. Appl. No. 11/445,957 dated Dec. 26, 2008; 5 pages.
USPTO Non-Final Rejection for U.S. Appl. No. 11/445,957 dated Feb. 26, 2008; 5 pages.
USPTO Non-Final Rejection for U.S. Appl. No. 11/445,957 dated Aug. 20, 2007; 8 pages.

* cited by examiner

*Primary Examiner* — Arnold Kinkead

(57) ABSTRACT

A phase lock loop pre-charging system and method are described. In one embodiment, a phase lock loop pre-charge system includes a bias component for generating a pre-charge voltage, and an activation component for activating the bias component. In one exemplary implementation the pre-charge voltage is utilized to facilitate pre-charging of a phase lock loop voltage controlled oscillator. In one embodiment, the bias component includes replica bias components that track the voltage controlled oscillation control voltage over varying process, voltage and temperature characteristics. The phase lock loop pre-charging systems and methods can be utilized to reduce lock time for a circuit.

13 Claims, 4 Drawing Sheets

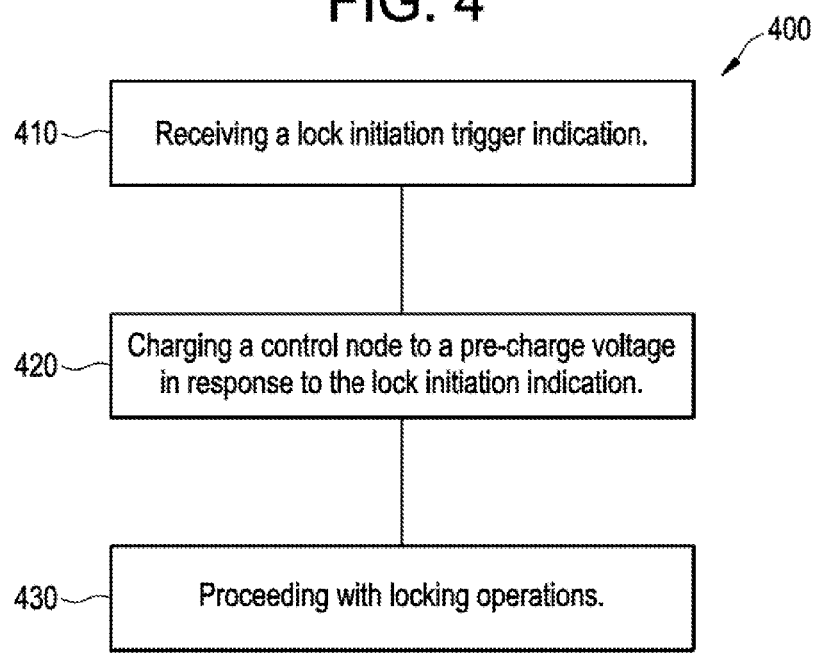

PHASE LOCK LOOP PRE-CHARGING SYSTEM AND METHOD

RELATED APPLICATIONS

This application is a continuation of, and claims priority from, U.S. Pat. No. 7,636,019 filed on Jun. 2, 2006. This Application also claims the benefit of U.S. Provisional Patent Application entitled "Fast lock circuit for a PLL", Ser. No. 60/688,523, Client Docket UCYPR-CD05030.PRO, filed on Jun. 7, 2005, which is incorporated herein by this reference.

TECHNICAL FIELD

The present invention relates generally to electronic circuits, and in particular to phase lock loop (PLL) circuits.

BACKGROUND

Electronic systems and circuits have made a significant contribution towards the advancement of modern society and are utilized in a number of applications to achieve advantageous results. Numerous electronic technologies such as digital computers, calculators, audio devices, video equipment, and telephone systems facilitate increased productivity and cost reduction in analyzing and communicating data, ideas and trends in most areas of business, science, education and entertainment. Many of the electronic systems that provide these advantageous results include oscillating electrical signals (e.g. clock signals, carrier signals, etc.). It is often important to accurately and rapidly regulate these oscillating signals (e.g., clock signals, carrier signals, etc).

Phase Lock Loops (PLL) are widely used in many types of electronic circuits for controlling oscillating signals. For example, Phase Lock Loops can be utilized to facilitate clock distribution, clock multiplication, skew suppression and a variety of other applications. Phase Lock Loops typically facilitate these activities by controlling a signal's phase and/or frequency. In some Phase Lock Loop applications, it is important to minimize the lock time (e.g., the time it takes the PLL to accomplish frequency and phase acquisition). Conventional Phase Lock Loops often alter loop bandwidth in an attempt to reduce lock time. However, changes in loop bandwidth can impact stability and thus conventional approaches often result in a trade off effect between lock time and stability. A high bandwidth loop usually results in a short lock time, but may compromise the loop stability (which in turn may itself impact the lock time). On the other hand, a low bandwidth loop usually has a longer lock time. Conventional approaches often attempt to alter the bandwidth of the PLL by altering the loop filter dynamics temporarily, for example by varying the loop filter resistor and/or temporarily increasing the charge pump current.

FIG. 1 shows an exemplary conventional PLL circuit that modifies the PLL bandwidth by altering the magnitude of the charge pump current (i.e. Bandwidth (BW) α Icp) according to the state of a lock condition (i.e. "locked" or "unlocked"). This type of conventional circuit usually includes a relatively complicated lock detector circuit 110. If the PLL is out of lock, the lock detector circuit 110 increases the loop bandwidth by increasing the charge pump 130 current from Icp1 to (Icp1+Icp2). This increased current is passed to the low pass filter 140 during each up refresh (UP) and down refresh (DN) from the phase frequency detector (PFD) 120. When the PLL is close to "locking" the feedback clock to the reference clock, the lock detector circuit reduces the loop bandwidth by switching to the lower charge pump current Icp1. Voltage controlled oscillator (VCO) 150 makes corresponding changes to an output signal which is fed back to a divider 170 and then to phase frequency detector (PFD) 120. Loop stability may be compromised by the increased bandwidth in such conventional approaches.

SUMMARY

A phase lock loop pre-charging system and method are described. In one embodiment, a phase lock loop pre-charge system includes a bias component for generating a pre-charge voltage, and an activation component for activating the bias component. In one exemplary implementation the pre-charge voltage is utilized to facilitate pre-charging of a phase lock loop filter capacitor. In one embodiment, the bias component includes replica components that track the voltage controlled oscillator control voltage over varying process, voltage and temperature characteristics. The phase lock loop pre-charging systems and methods can be utilized to reduce lock time for a circuit.

BRIEF DESCRIPTION OF THE DRAWINGS

FIG. 4 is a flow chart of an exemplary phase lock loop pre-charging method in accordance with one embodiment of the present invention.

DETAILED DESCRIPTION

Reference will now be made to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail so as not to unnecessarily obscure aspects of the current invention.

Embodiments of the present invention are well suited to performing various other steps or variations of the steps recited herein, and in a sequence other than that depicted and/or described herein. It is appreciated that embodiments of the present invention can include hardware, firmware, and/or software. In one embodiment, processors and other electrical and electronic components perform processing associated with the present invention (e.g., executing computer readable and computer executable instructions comprising code included in a computer usable medium).

Present invention systems and methods facilitate pre-charging of a phase lock loop voltage controlled oscillator input node. In one embodiment, the phase lock loop voltage controlled oscillator input node is pre-charged to a level that facilitates rapid lock time. The reduction in lock time can be achieved without increasing bandwidth or adversely impacting stability. In one exemplary implementation, the phase lock loop voltage controlled oscillator input node is pre-charged to lie within a midpoint range of the voltage controlled oscillator characteristics. It is appreciated that the pre-charge level can be altered in accordance with a variety of objectives including lock time considerations, power consumption, component requirements and capabilities, etcetera. In one embodiment, characteristics of the voltage controlled oscillator input stage are replicated in a manner that tracks process, voltage and temperature (PVT) variations of the voltage controlled oscillator input stage. It is appreciated that present invention systems and methods can be applied to a variety of phase lock loop architectures that utilize capacitors (e.g. a filter capacitor) to filter the input node of a phase lock loop voltage controlled oscillator.

Figure 1:
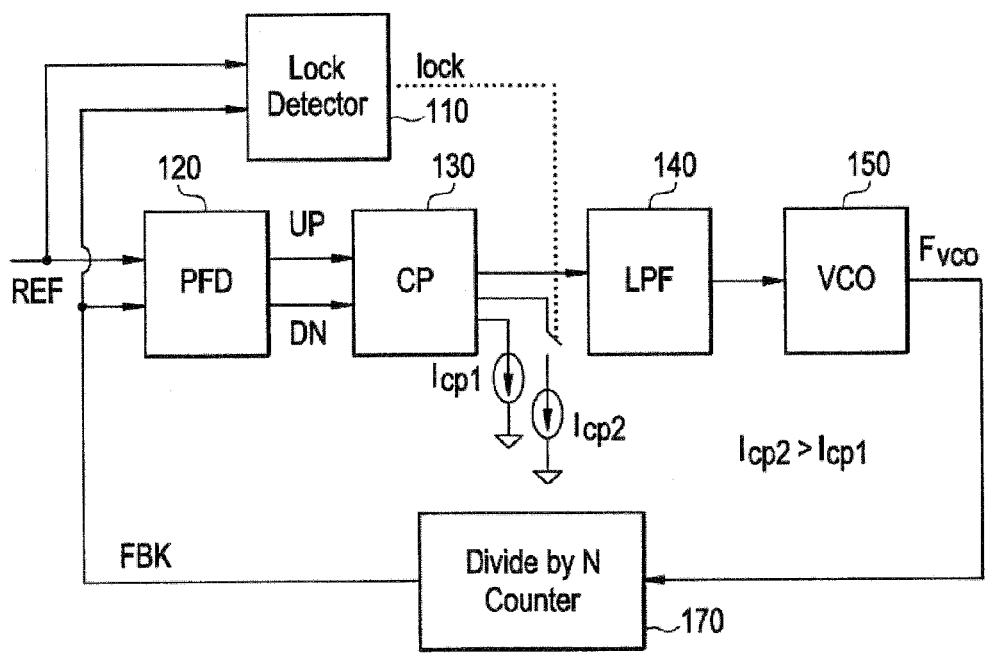
FIG. 1 is an exemplary conventional circuit attempt that modifies the phase locked loop (PLL) bandwidth by altering the magnitude of the charge pump current.
Figure 2:
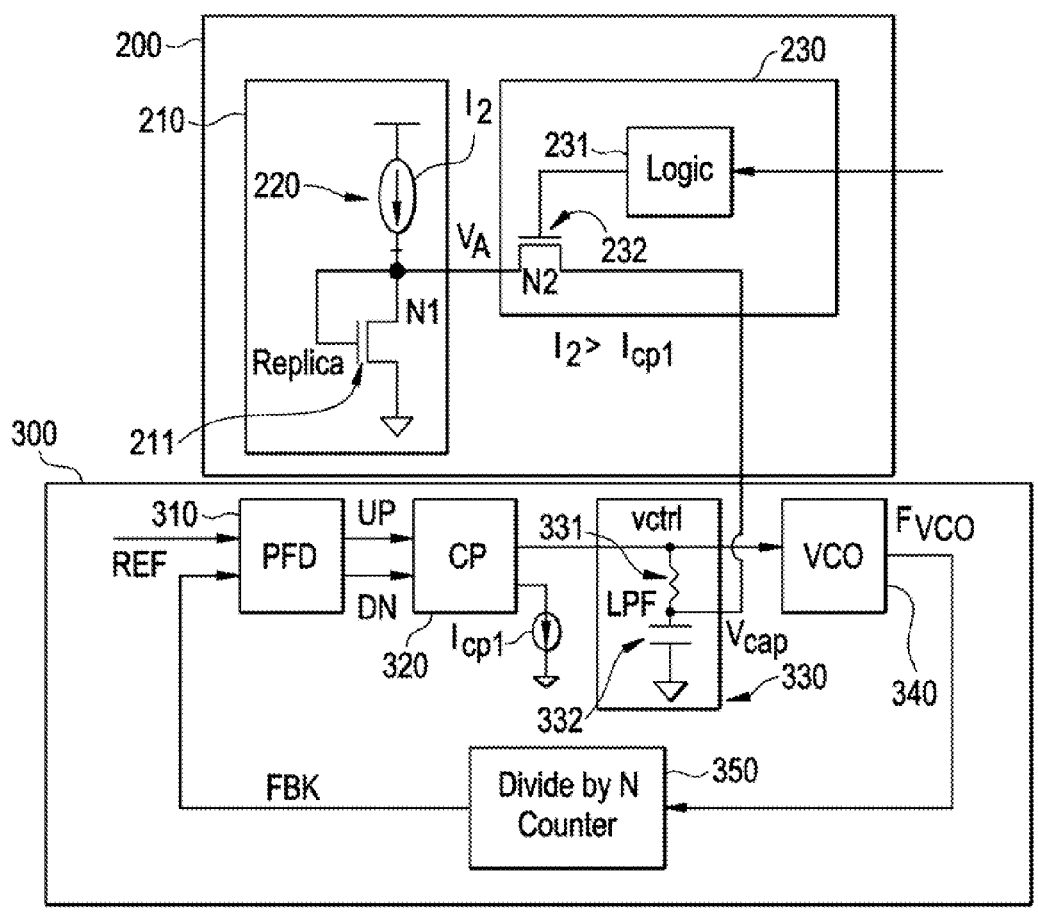
FIG. 2 is a block diagram of exemplary phase lock loop pre-charge system in accordance with one embodiment of the present invention.

FIG. 2 is a block diagram of exemplary phase lock loop pre-charge system 200 in accordance with one embodiment of the present invention. Phase lock loop pre-charge system 200 includes bias component 210, and activation component 230. In one embodiment, bias component 210 replicates portions of a phase lock loop voltage controlled oscillator input stage. In one exemplary implementation, bias component 210 includes transistor 211 and current source 220. It is appreciated that bias component 210 can include additional components (e.g., additional transistors) to permit flexible implementation. In one embodiment, activation component 230 includes a switch 232 and logic 231.

The components of phase lock loop pre-charge system 200 cooperatively operate to pre-charge a phase lock loop. In one embodiment, phase lock loop pre-charge system 200 facilitates pre-charging of a phase lock loop voltage controlled oscillator control node. Bias component 210 generates a pre-charge voltage. In one embodiment, current source 220 supplies a pre-charge current to transistor 211. In one exemplary implementation, transistor 211 and current source 220 are subject to PVT variances and has characteristics similar to the current biasing of the internal ring oscillator in a phase lock loop voltage controlled oscillator. For example, the ring oscillator current biasing can be a function of the same variables as current source 220. Activation component 230 controls bias component 210. In one exemplary implementation, activation component 230 controls the pre-charge duration. It is appreciated that phase lock loop pre-charge system 200 can include a variety of configurations.

In one embodiment, bias component 210 includes component that replicates portions of a phase lock loop oscillator input stage. In one exemplary implementation, transistor 211 is a replica of components of a phase lock loop voltage controlled oscillator input stage. In one exemplary implementation, transistor 211 replicates components of a signal converter (e.g., a voltage to current converter) included in the phase lock loop voltage controlled oscillator input stage and the voltage on the node of transistor 211 is the same as the input to the phase lock loop voltage controlled oscillator. In one embodiment, transistor 211 is a scaled replica in the sense it is smaller than a transistor in the signal converter of a phase lock loop voltage controlled oscillator input stage. In one exemplary implementation, the bias component 210 pre-charge voltage lies within a midpoint range of a phase lock loop oscillator characteristics.

In one embodiment, phase lock loop pre-charge system 200 is coupled to exemplary phase lock loop (PLL) 300 in accordance with one embodiment of the present invention. Phase lock loop (PLL) 300 includes phase frequency detector (PFD) 310, a charge pump (CP) 320, a low pass filter (LPF) 330, a voltage controlled oscillator (VCO) 340 and an optional divider 350. The components phase frequency detector (PFD) 310, a charge pump (CP) 320, a low pass filter (LPF) 330, a voltage controlled oscillator (VCO) 340 and an optional divider 350 are sequentially coupled to form a "loop".

The components of phase lock loop 300 cooperatively operate to perform phase and/or frequency adjustments. Phase frequency detector (PFD) 310 compares the phase difference between an input reference clock (REF) and a feedback clock (FBK). When the REF clock is leading the FBK clock in phase, phase frequency detector 310 outputs an UP pulse that is wider than its DN pulse. In contrast, when the REF clock is lagging the FBK clock, phase frequency detector 310 outputs a DN pulse that is wider than its UP pulse. The Charge Pump (CP) 320 circuit either charges or discharges Low Pass Filter (LPF) 330 with a charge pump current Icp1 depending on whether phase frequency detector 310 forces charge pump 320 to pump up or pump down. Low pass filter 330 integrates the pulsed charge pump currents from charge pump 320 to produce a filtered voltage (e.g., designated "vctrl") at the input to voltage controlled oscillator (VCO) 340. The output signal (e.g., designated "Fvco") of voltage control oscillator 340 is fed to divider 350. It should be noted that the divider 350 is optional and not strictly required. The output of divider 350 is the feedback clock (e.g., designated "FBK") that is fed back to phase frequency detector 310.

Phase lock loop pre-charge system 200 facilitates pre-charging of the input node of voltage controlled oscillator 340. In one exemplary implementation, phase lock loop pre-charge system 200 pre-charges the low pass filter capacitor 332 node providing a fast and stable lock for the phase lock loop (PLL) 300. It is appreciated that the present technique of pre-charging can be applied to variety of "charge pump" PLL architectures to facilitate lock time reduction.

The pre-charge circuit includes logic circuit 231 whose output is coupled to a switch 232 (e.g., transistor N2) between the relatively largely capacitive node VCAP and bias circuit 210. The bias circuit 210 includes current source 220 coupled to transistor 211 (e.g., nmos N1 configured as a diode). In one exemplary implementation, in order to achieve lock, the vctrl node is charged up to a particular target voltage. The improved present technique uses pre-charge circuit 200 to pre-charge the PLL loop filter capacitor node vcap to an optimal voltage vctd_opt close to the target voltage to accelerate the lock process and hence reduce lock time. As shown in FIG. 2, the loop filter capacitor 332 is coupled through the loop filter resistor 331 to the VCO control node. The pre-charge circuit 200 keeps the vcap voltage at this voltage until disengaged. The pre-charge circuit 200 is disengaged when switch 232 is turned off and the PLL proceeds to acquire lock by the feedback mechanism of the phase lock loop. It should be noted that the phase frequency detector (PFD) 310 and charge pump (CP) 320 may not necessarily be disconnected, but that the pre-charge circuit 200 may be designed such as to override the PFD/CP when activated. This may involve choosing a current value in current source 220 that is much larger than the maximum current available from the charge pump 320.

It is appreciated that there are a variety of control schemes for logic circuit 231. In one embodiment, logic circuit 231 includes an OR gate and the control is directed by a standby indication and power on reset indication (POR). The charge time is set by the standby indication and power on reset indication (POR) in accordance with the following table:

| LLD | POR | COMMENT |
| --- | --- | --- |
| 0 | 1 | VCO input voltage driven by the fast lock pre-charge and CP. |
| 0 | 0 | VCO input is driven by the charge pump CP. The fast lock pre-charge circuit is off. |
| 1 | 0 | VCO input voltage driven by the fast lock pre-charge and CP. |
| 1 | 1 | VCO input voltage driven by the fast lock pre-charge and CP. |

In one exemplary implementation, the standby indication can be associated with the presence of a reference clock and in the event the reference clock disappears the standby indication (LLD) is a logical "1". The power on reset (POR) logical sense is that a logical "1" enables power on reset.

The pre-charge voltage can be chosen to correspond to a variety of objectives, including rapid lock time, power conservation, component expense, etcetera. In one embodiment, the pre-charge voltage is optimally chosen to lie close to a midpoint range associated with VCO characteristics. For example, the pre-charge voltage can be chosen to be close to a midpoint associated with a VCO gain characteristic defining the frequency output for a given input control voltage. In one exemplary implementation, there is a range of frequencies associated with an application and a Phase Lock Loop is utilized to lock to target frequencies within the range. Choosing a midpoint within the range enables a predictable timeframe to lock to a frequency within the range because it takes less time to get from the pre-charge control voltage to the target voltage.

Figure 3A:
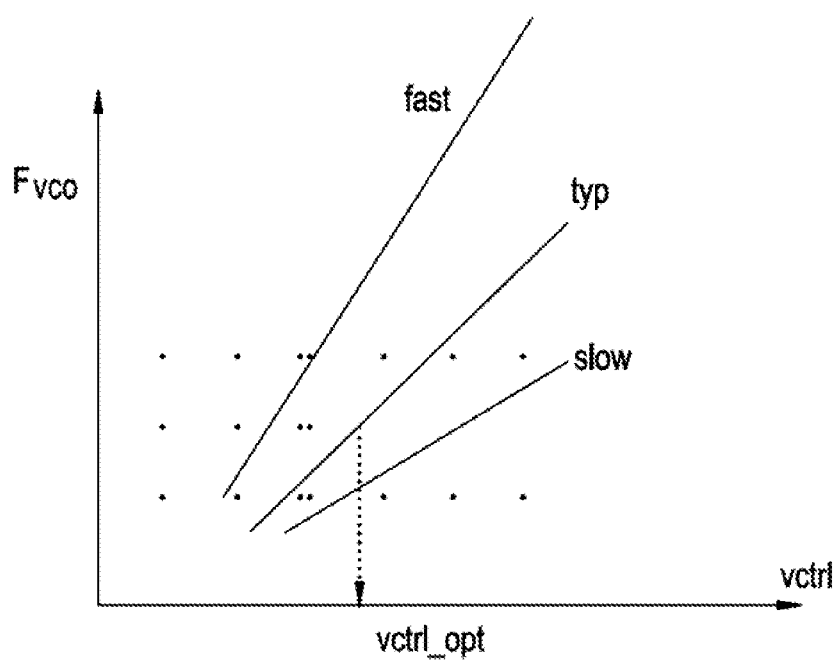
FIG. 3A shows an example VCO output frequency versus input control voltage characteristic across corners.

FIG. 3A shows an exemplary representation of VCO gain characteristics. The relationship of VCO output frequency versus an input control voltage characteristic across process corners is depicted. Each line (e.g., slow, typical and fast) represents a different process corner. While relatively simplistic straight lines are shown so as not to obscure the invention, it is appreciated that the VCO characteristic curves can be more complex and can include voltage and temperature impacts. The VCO frequency is displayed on the y-axis and the VCO input control voltage is displayed on the x-axis. The pre-charge voltage (e.g., vctrl_opt) can be chosen to best satisfy a midpoint range of the VCO operating region over PVT changes.

Figure 3B:
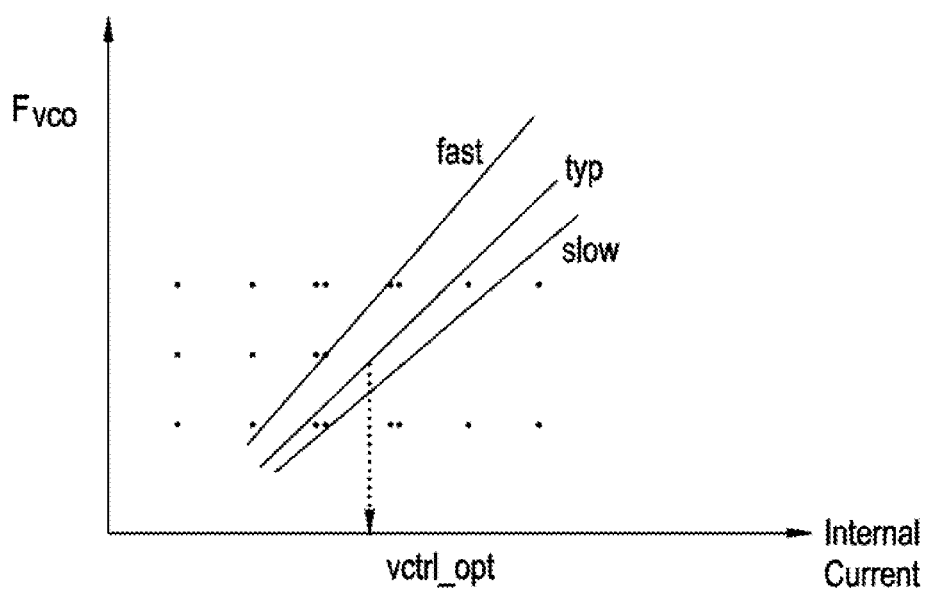
FIG. 3B shows an exemplary improved VCO output frequency versus internal current characteristic across corners.

In one embodiment, a replica bias component is utilized and differences between the fast, typical and slow characteristics are narrowed. The pre-charge voltage is achieved by utilizing a transistor 211 that is a replica of a VCO input transistor. The replica transistor therefore tracks the VCO input device over process, voltage and temperature (PVT) variations. FIG. 3B shows an exemplary improved VCO output frequency versus internal current characteristic across corners (slow, typical and fast) when utilizing a replica bias component.

FIG. 4 is a flow chart of exemplary phase lock loop pre-charging method 400 in accordance with one embodiment of the present invention.

In block 410, a lock initiation trigger indication is received. In one embodiment, the lock initiation trigger indication corresponds to a centering event. In one exemplary implementation, a pre-charge value is provided to facilitate achieving a target output of phase lock loop voltage controlled oscillator and a centering event is an event that could impact the voltage controlled oscillator ability to provide the target output. For example, start-up, entering sleep, or other centering events, when power levels could otherwise drift at the phase lock loop voltage controlled oscillator without the pre-charge. For example, at start up or power on reset it can take a while for the input of the voltage controlled oscillator to reach a target value and pre-charging assists with quicker realization of the target value.

At block 420, a control node is charged to a pre-charge voltage in response to said lock initiation indication. In one embodiment, the pre-charging facilitates stability and bandwidth preservation. It is appreciated the charging can be performed in a variety of phase lock loop architectures. In one exemplary implementation, the pre-charge voltage corresponds to an approximate point or region in the phase lock loop voltage control oscillator characteristics.

Phase lock loop operations proceed in block 430. In one embodiment, a frequency and/or phase of a signal is altered and the result is fed back into a phase comparison which compares the feedback clock to a reference clock. The results of the comparison are utilized to make adjustments until the feedback clock is locked to the reference clock.

In one embodiment, the pre-charge circuit and/or phase lock loop characteristics are programmed. In one exemplary implementation, the pre-charge circuit programming tracks programming of the phase lock loop voltage controlled oscillator characteristics.

Thus, the present invention is a system and method that facilitates reduction of phase lock loop lock time with minimal or no impact on stability. Reduction of phase lock loop time can be accomplished without increasing bandwidth. Present invention systems and methods can also track process voltage and temperature (PVT) variation of a phase lock loop voltage control oscillator. The phase lock loop lock time reduction can be accomplished without a complicated lock detector circuit and minimal or no change in loop dynamics.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A phase lock loop (PLL) pre-charge system comprising:
a bias component for generating a pre-charge voltage; and
an activation component for controlling said bias component;
the activation component configured to activate an output switch of the bias component for a duration determined by a system power state;
the duration determined from a combination of a standby system power state and a power on reset system power state.

2. The PLL pre-charge system of claim 1, further comprising:
a voltage controlled oscillator (VCO) coupled to the loop filter; and
a transistor ground shunt of the bias component configured to replicate an input transistor of the VCO.

3. The PLL pre-charge system of claim 2, further comprising:
the transistor ground shunt configured to replicate a transistor of an input signal converter of the VCO.

4. The PLL pre-charge system of claim 3, further comprising:
the transistor ground shunt configured as a scaled down replica of the VCO input signal converter transistor.

5. A phase lock loop (PLL), comprising:
a loop filter,
a voltage controlled oscillator (VCO);
a bias component for generating a pre-charge voltage to the loop filter, the bias component comprising a transistor ground shunt configured to replicate an input transistor of the VCO; and
an activation component for controlling the bias component, the activation component configured to operate the bias component to vary a pre-charge level of the VCO.

6. The PLL of claim 5, further comprising:
the activation component configured to switch an output of the bias component to an input of a loop filter of the VCO for a duration determined from a combination of a standby system power state and a power on reset system power state.

7. The PLL of claim 5, further comprising:
the transistor ground shunt configured to replicate a transistor of an input signal converter of the VCO.

8. The PLL of claim 7, further comprising:
the transistor ground shunt configured as a scaled down replica of the VCO input signal converter transistor.

9. A method of controlling a phase lock loop (PLL), the method comprising:
generating a pre-charge voltage on a loop filter of a voltage controlled oscillator of the PLL;
operating a bias component to control controlling the pre-charge voltage according to a system power state; and
replicating an input transistor of the VCO in a transistor ground shunt of the bias component.

10. The method of claim 9, further comprising:
activating a pre-charge output of the bias component for a duration determined from a combination of a standby system power state and a power on reset system power state.

11. The method of claim 9, further comprising:
controlling the voltage controlled oscillator (VCO) of the PLL with an output of the loop filter.

12. The method of claim 9, further comprising:
the transistor ground shunt configured to replicate a transistor of an input signal converter of the VCO.

13. The method of claim 12, further comprising:
the transistor ground shunt configured as a scaled down replica of the VCO input signal converter transistor.

* * * * *